United States Patent
Yoshikawa et al.

(10) Patent No.: US 12,218,228 B2
(45) Date of Patent: Feb. 4, 2025

(54) SEMICONDUCTOR DEVICE AND MANUFACTURING METHOD

(71) Applicant: FUJI ELECTRIC CO., LTD., Kanagawa (JP)

(72) Inventors: Koh Yoshikawa, Matsumoto (JP); Masayuki Momose, Matsumoto (JP); Toshiyuki Matsui, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 566 days.

(21) Appl. No.: 17/409,809

(22) Filed: Aug. 24, 2021

(65) Prior Publication Data

US 2021/0384330 A1    Dec. 9, 2021

Related U.S. Application Data

(63) Continuation of application No. PCT/JP2020/034015, filed on Sep. 8, 2020.

(30) Foreign Application Priority Data

Sep. 11, 2019   (JP) .................................. 2019-165167

(51) Int. Cl.
*H01L 29/66*    (2006.01)
*H01L 29/06*    (2006.01)
(Continued)

(52) U.S. Cl.
CPC ...... *H01L 29/7396* (2013.01); *H01L 29/0696* (2013.01); *H01L 29/4236* (2013.01); *H01L 29/66348* (2013.01); *H01L 29/7811* (2013.01)

(58) Field of Classification Search
CPC ............. H01L 29/7396; H01L 29/0696; H01L 29/4236; H01L 29/66348; H01L 29/7811;
(Continued)

(56) References Cited

U.S. PATENT DOCUMENTS

| | | | |
|---|---|---|---|
| 6,482,681 | B1 | 11/2002 | Francis |
| 10,304,928 | B2 | 5/2019 | Tamura |

(Continued)

FOREIGN PATENT DOCUMENTS

| | | |
|---|---|---|
| CN | 108604594 A | 9/2018 |
| JP | 2007266233 A | 10/2007 |

(Continued)

OTHER PUBLICATIONS

Extended European Search Report for European Patent Application No. 20863310.7, issued by the European Patent Office on Apr. 7, 2022.

(Continued)

*Primary Examiner* — Shaun M Campbell
*Assistant Examiner* — Teresa M. Arroyo

(57) ABSTRACT

Provided is a semiconductor device, including: a semiconductor substrate including a bulk donor; an active portion provided on the semiconductor substrate; and an edge termination structure portion provided between the active portion and an end side of the semiconductor substrate on a upper surface of the semiconductor substrate; wherein the active portion includes hydrogen, and has a first high concentration region with a higher donor concentration than a bulk donor concentration; and the edge termination structure portion, which is provided in a range that is wider than the first high concentration region in a depth direction of the semiconductor substrate, includes hydrogen, and has a second high concentration region with a higher donor concentration than the bulk donor concentration.

12 Claims, 11 Drawing Sheets

(51) Int. Cl.
  *H01L 29/423* (2006.01)
  *H01L 29/739* (2006.01)
  *H01L 29/78* (2006.01)

(58) Field of Classification Search
  CPC . H01L 29/36; H01L 29/0619; H01L 29/0638;
     H01L 29/0834; H01L 29/32; H01L
     29/407; H01L 29/4238; H01L 29/8613;
     H01L 29/7397; H01L 29/0607; H01L
     29/7813; H01L 21/26506; H01L 21/266
  See application file for complete search history.

(56) References Cited

U.S. PATENT DOCUMENTS

| | | | |
|---|---|---|---|
| 2007/0231973 A1 | 10/2007 | Ruething | |
| 2011/0042791 A1 | 2/2011 | Schulze | |
| 2012/0267681 A1 | 10/2012 | Nemoto | |
| 2013/0249058 A1 | 9/2013 | Neidhart | |
| 2013/0260515 A1 | 10/2013 | Mizushima | |
| 2013/0320487 A1* | 12/2013 | Mauder | H01L 29/872 257/E21.546 |
| 2014/0246750 A1 | 9/2014 | Takishita | |
| 2014/0246755 A1 | 9/2014 | Yoshimura | |
| 2014/0284657 A1 | 9/2014 | Nemoto | |
| 2015/0050754 A1 | 2/2015 | Ploss | |
| 2015/0050798 A1 | 2/2015 | Kobayashi | |
| 2015/0069462 A1 | 3/2015 | Mizushima | |
| 2015/0179441 A1 | 6/2015 | Onozawa | |
| 2015/0214347 A1 | 7/2015 | Falck | |
| 2015/0270132 A1 | 9/2015 | Laven | |
| 2015/0311279 A1 | 10/2015 | Onozawa | |
| 2015/0357229 A1 | 12/2015 | Schulze | |
| 2015/0371858 A1 | 12/2015 | Laven | |
| 2016/0141399 A1 | 5/2016 | Jelinek | |
| 2016/0172438 A1 | 6/2016 | Jelinek | |
| 2016/0284825 A1 | 9/2016 | Onozawa | |
| 2017/0084701 A1* | 3/2017 | Kitamura | H01L 29/1608 |
| 2017/0170273 A1 | 6/2017 | Naito | |
| 2017/0178947 A1* | 6/2017 | Wisotzki | H01L 21/762 |
| 2018/0005829 A1 | 1/2018 | Takishita | |
| 2018/0005831 A1 | 1/2018 | Schulze | |
| 2018/0012762 A1 | 1/2018 | Mukai | |
| 2018/0122895 A1 | 5/2018 | Jelinek | |
| 2018/0350961 A1 | 12/2018 | Naito | |
| 2019/0139772 A1 | 5/2019 | Kodama | |

FOREIGN PATENT DOCUMENTS

| | | | |
|---|---|---|---|
| JP | 2013197306 A | 9/2013 | |
| JP | 2016009728 A | 1/2016 | |
| JP | 2017112134 A | 6/2017 | |
| JP | 2017224837 A | 12/2017 | |
| JP | 2019087635 A | 6/2019 | |
| WO | 2011052787 A1 | 5/2011 | |
| WO | 2013089256 A1 | 6/2013 | |
| WO | 2013100155 A1 | 7/2013 | |
| WO | 2013141181 A1 | 9/2013 | |
| WO | 2014065080 A1 | 5/2014 | |
| WO | 2014208404 A1 | 12/2014 | |
| WO | 2017047276 A1 | 3/2017 | |
| WO | 2017047285 A1 | 3/2017 | |
| WO | 2018105299 A1 | 6/2018 | |
| WO | WO-2019181852 A1* | 9/2019 | H01L 21/22 |

OTHER PUBLICATIONS

International Search Report and (ISA/237) Written Opinion of the International Search Authority for International Patent Application No. PCT/JP2020/034015, mailed by the Japan Patent Office on Dec. 8, 2020.

Office Action issued for counterpart Japanese Application No. 2021-195999, issued by the Japanese Patent Office on Jul. 18, 2023 (drafted on Jul. 10, 2023).

Office Action issued for counterpart Chinese Application 202080016339. 4, issued by The State Intellectual Property Office of People's Republic of China on Jan. 31, 2024.

* cited by examiner

SEMICONDUCTOR DEVICE AND MANUFACTURING METHOD

The contents of the following Japanese patent applications are incorporated herein by reference:
NO.2019-165167 filed in JP on Sep. 11, 2019, and
PCT/JP2020/034015 filed in WO on Sep. 8, 2020

BACKGROUND

1. Technical Field

The present invention relates to a semiconductor device and a manufacturing method.

2. Related Art

Conventionally, a technology is known in which hydrogen is implanted and diffused at a predetermined depth in a semiconductor substrate, so that the hydrogen can combine with lattice defects formed at the depth of implantation and in the diffusion region to become a donor, thereby increasing the doping concentration (refer to, for example, Patent Document 1).
Patent Document 1: WO No. 2011/52787

3. Technical Problem

A semiconductor substrate may be provided with an active portion where transistors and other components are provided, and an edge termination structure portion that is arranged outside the active portion and includes guard rings and other components. The active portion is provided with a structure that is not desirable for hydrogen to pass through, such as a gate oxide film. This limits the range in which high doping concentration regions can be formed in the depth direction. On the other hand, the more low doping concentration regions remain in the edge termination structure portion, the more difficult it becomes to improve the breakdown voltage.

GENERAL DISCLOSURE

In order to solve the above problem, a first aspect of the present invention provides a semiconductor device including a semiconductor substrate including a bulk donor. The semiconductor device may include an active portion provided on the semiconductor substrate. The semiconductor device may include an edge termination structure portion provided on the upper surface of the semiconductor substrate, between the active portion and the end side of the semiconductor substrate. The active portion may have a first high concentration region that includes hydrogen and has a higher donor concentration than the bulk donor concentration. The edge termination structure portion may have a second high concentration region provided in a region that is wider than the first high concentration region in the depth direction of the semiconductor substrate, includes hydrogen, and has a higher donor concentration than the bulk donor concentration.

The second high concentration region may be in contact with the upper surface of the semiconductor substrate.

The hydrogen concentration distribution in the depth direction in the first high concentration region may have a first hydrogen concentration peak on the upper surface side of the semiconductor substrate.

In the edge termination structure portion, the hydrogen concentration at the same depth position with the first hydrogen concentration peak may be lower than the hydrogen concentration at the first hydrogen concentration peak.

The active portion may have a trench portion provided on the upper surface of the semiconductor substrate. The first hydrogen concentration peak may be arranged in a region from the center of the depth direction of the semiconductor substrate to the bottom portion of the trench portion.

A donor concentration at the first hydrogen concentration peak may be $1.0 \times 10^{13}/cm^3$ or more but not more than $2.0 \times 10^{14}/cm^3$ or less.

The donor concentration at the first hydrogen concentration peak may be 3 times or more, but not more than 7 times, the donor concentration in the first high concentration region on the lower surface side of the semiconductor substrate than the first hydrogen concentration peak.

At a depth position on the lower surface side of the semiconductor substrate than the first hydrogen concentration peak, the donor concentration in the first high concentration region may be the same as the donor concentration in the second high concentration region.

At the depth position on the upper surface side of the semiconductor substrate above the first hydrogen concentration peak, the donor concentration in the second high concentration region may be higher than the donor concentration in the active portion.

The active portion may have a plurality of gate trench portions provided on the upper surface of the semiconductor substrate at a predetermined interval along the array direction. Among the plurality of gate trench portions, the distance in the array direction between the gate trench portion arranged at the end of the array direction and the second high concentration region may be 3 times or more than the standard deviation of the first hydrogen concentration peak.

A P type well region may be provided between the active portion and the edge termination structure portion on the upper surface of the semiconductor substrate and may be provided deeper than the lower end of the gate trench portion from the upper surface of the semiconductor substrate. The boundary between the first high concentration region and the second high concentration region in the array direction may overlap the well region in the depth direction.

In a second aspect of the present invention, a manufacturing method of the semiconductor device of the first aspect is provided. The manufacturing method may include implanting hydrogen from the lower surface of the semiconductor substrate while a shielding portion is formed in the region where the active portion is provided on the lower surface of the semiconductor substrate and the lower surface of the semiconductor substrate in the region where the second high concentration region is provided is exposed. The manufacturing method may include heat treating the semiconductor substrate.

During hydrogen implanting, the hydrogen implanted in the region where the second high concentration region is provided may pass through the semiconductor substrate, while the hydrogen implanted in the region where the active portion is provided may not have to pass through the semiconductor substrate.

The summary clause does not necessarily describe all necessary features of the embodiments of the present invention. The present invention may also be a sub-combination of the features described above.

DESCRIPTION OF EXEMPLARY EMBODIMENTS

Figure 1:
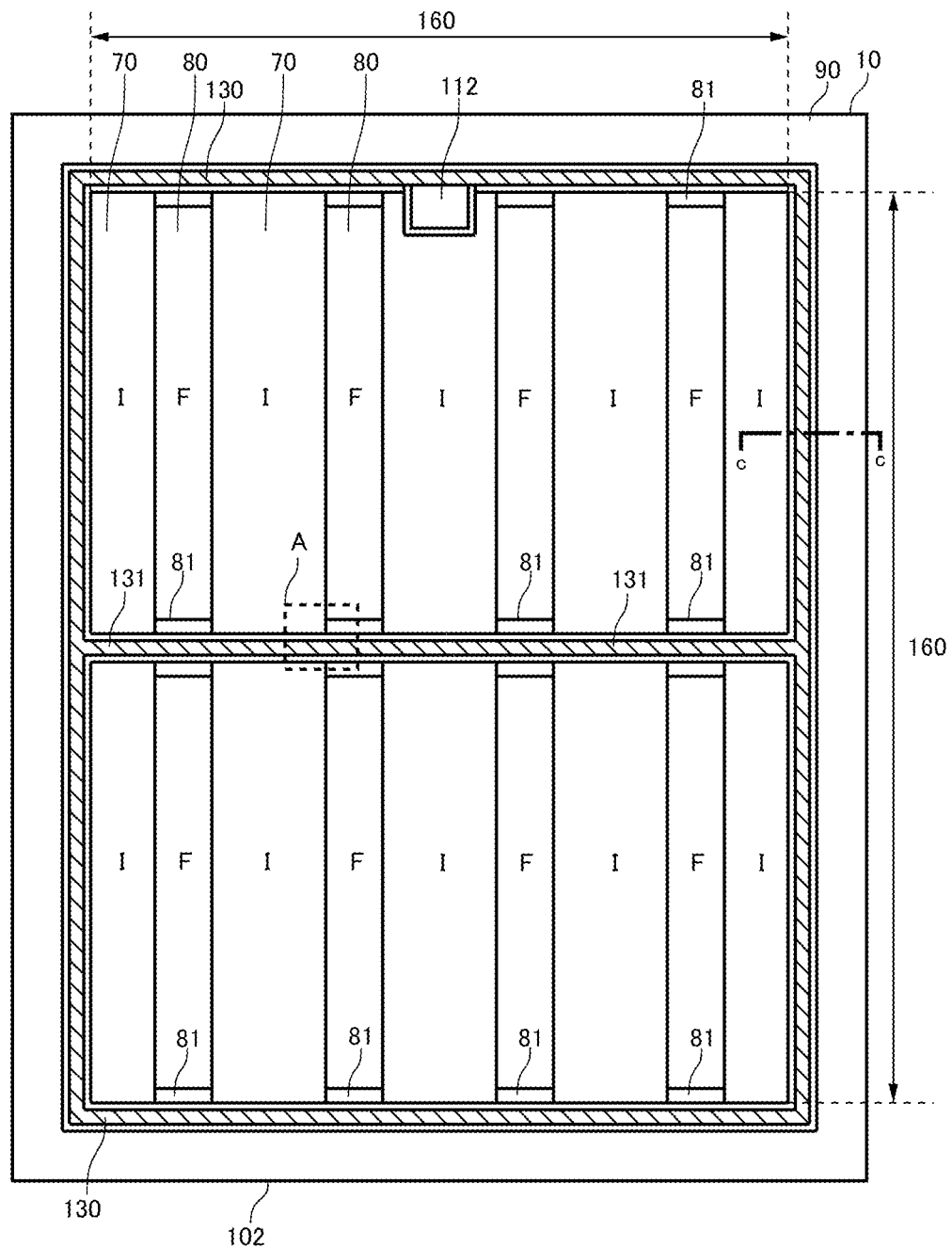
FIG. 1 illustrates a top view showing one example of a semiconductor device 100 according to one embodiment of the present invention.

Hereinafter, the invention will be described through embodiments of the invention, but the following embodiments do not limit the invention according to claims. In addition, not all of the combinations of features described in the embodiments are essential to the solving means of the invention.

As used herein, one side in a direction parallel to a depth direction of a semiconductor substrate is referred to as "upper" and the other side is referred to as "lower". One surface of two principal surfaces of a substrate, a layer or other member is referred to as an upper surface, and the other surface is referred to as a lower surface. "Upper" and "lower" directions are not limited to a direction of gravity, or a direction in which a semiconductor device is mounted.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate the height direction with respect to the ground. Note that a +Z axis direction and a −Z axis direction are directions opposite to each other. When the Z axis direction is described without describing the signs, it means that the direction is parallel to the +Z axis and the −Z axis.

In the present specification, orthogonal axes parallel to the upper surface and the lower surface of the semiconductor substrate are referred to as the X axis and the Y axis. Further, an axis perpendicular to the upper surface and the lower surface of the semiconductor substrate is referred to as the Z axis. In the present specification, the direction of the Z axis may be referred to as the depth direction. Further, in the present specification, a direction parallel to the upper surface and the lower surface of the semiconductor substrate may be referred to as a horizontal direction, including an X axis direction and a Y axis direction.

In the present specification, a case where a term such as "same" or "equal" is mentioned may include a case where an error due to a variation in manufacturing or the like is included. The error is, for example, within 10%.

In the present specification, a conductivity type of doping region where doping has been carried out with an impurity is described as a P type or an N type. In the present specification, the impurity may particularly mean either a donor of the N type or an acceptor of the P type, and may be described as a dopant. In the present specification, doping means introducing the donor or the acceptor into the semiconductor substrate and turning it into a semiconductor presenting a conductivity type of the N type, or a semiconductor presenting conductivity type of the P type.

In the present specification, a doping concentration means a concentration of the donor or a concentration of the acceptor in a thermal equilibrium state. In the present specification, a net doping concentration means a net concentration obtained by adding the donor concentration set as a positive ion concentration to the acceptor concentration set as a negative ion concentration, taking into account of polarities of charges. As an example, when the donor concentration is $N_D$ and the acceptor concentration is $N_A$, the net doping concentration at any position is given as $N_D$-$N_A$. In the present specification, the net doping concentration may be simply referred to as the doping concentration.

The donor has a function of supplying electrons to a semiconductor. The acceptor has a function of receiving electrons from the semiconductor. The donor and the acceptor are not limited to the impurities themselves. For example, a VOH defect which is a combination of a vacancy (V), oxygen (O), and hydrogen (H) existing in the semiconductor functions as the donor that supplies electrons. In the present specification, the VOH defect may be referred to as a hydrogen donor.

In the present specification, a description of a P+ type or an N+ type means a higher doping concentration than that of the P type or the N type, and a description of a P− type or an N− type means a lower doping concentration than that of the P type or the N type. Further, in the specification, a description of a P++ type or an N++ type means a higher doping concentration than that of the P+ type or the N+ type.

A chemical concentration in the present specification indicates an atomic density of an impurity measured regardless of an electrical activation state. The chemical concentration can be measured by, for example, secondary ion mass spectrometry (SIMS). The net doping concentration described above can be measured by voltage-capacitance profiling (CV profiling) Further, a carrier concentration measured by spreading resistance profiling (SRP method) may be set as the net doping concentration. The carrier concentration measured by the CV profiling or the SRP method may be a value in a thermal equilibrium state. Further, in a region of the N type, the donor concentration is sufficiently higher than the acceptor concentration, and thus the carrier concentration of the region may be set as the donor concentration. Similarly, in a region of the P type, the carrier concentration of the region may be set as the acceptor concentration. In the present specification, the doping concentration of the N type region may be referred to as the donor concentration, and the doping concentration of the P type region may be referred to as the acceptor concentration.

Further, when a concentration distribution of the donor, acceptor, or net doping has a peak in a region, a value of the peak may be set as the concentration of the donor, acceptor, or net doping in the region. In a case where the concentration of the donor, acceptor or net doping is approximately uniform in a region, or the like, an average value of the concentration of the donor, acceptor or net doping in the region may be set as the concentration of the donor, acceptor or net doping.

The carrier concentration measured by the SRP method may be lower than the concentration of the donor or the acceptor. In a range where a current flows when a spreading resistance is measured, carrier mobility of the semiconductor substrate may be lower than a value in a crystalline state. The reduction in carrier mobility occurs when carriers are scattered due to disorder (disorder) of a crystal structure due to a lattice defect or the like.

The concentration of the donor or the acceptor calculated from the carrier concentration measured by the CV profiling or the SRP method may be lower than a chemical concentration of an element indicating the donor or the acceptor. As an example, in a silicon semiconductor, a donor concentration of phosphorous or arsenic serving as a donor, or an acceptor concentration of boron (boron) serving as an acceptor is approximately 99% of chemical concentrations of these. On the other hand, in the silicon semiconductor, a donor concentration of hydrogen serving as a donor is approximately 0.1% to 10% of a chemical concentration of hydrogen.

FIG. 1 illustrates a top view showing one example of the semiconductor device 100 according to one embodiment of the present invention. FIG. 1 shows a position at which each member is projected on an upper surface of a semiconductor substrate 10. FIG. 1 shows merely some members of the semiconductor device 100, and omits illustrations of some members.

The semiconductor device 100 includes the semiconductor substrate 10. The semiconductor substrate 10 is a substrate that is formed of a semiconductor material. As an example, the semiconductor substrate 10 is a silicon substrate. The semiconductor substrate 10 has an end side 102 in the top view. When merely referred to as the top view in the present specification, it means that the semiconductor substrate 10 is viewed from an upper surface side. The semiconductor substrate 10 of this example has two sets of end sides 102 opposite to each other in the top view. In FIG. 1, the X axis and the Y axis are parallel to any of the end sides 102. In addition, the Z axis is perpendicular to the upper surface of the semiconductor substrate 10.

The semiconductor substrate 10 is provided with an active portion 160. The active portion 160 is a region where a main current flows in the depth direction between the upper surface and a lower surface of the semiconductor substrate 10 when the semiconductor device 100 operates. An emitter electrode is provided above the active portion 160, but is omitted in FIG. 1.

The active portion 160 is provided with at least one of a transistor portion 70 including a transistor element such as an IGBT, and a diode portion 80 including a diode element such as a freewheeling diode (FWD). In the example of FIG. 1, the transistor portion 70 and the diode portion 80 are alternately arranged along a predetermined array direction (the X axis direction in this example) on the upper surface of the semiconductor substrate 10. The active portion 160 in another example may be provided with only one of the transistor portion 70 and the diode portion 80.

In FIG. 1, a region where each of the transistor portions 70 is arranged is indicated by a symbol "I", and a region where each of the diode portions 80 is arranged is indicated by a symbol "F". In the present specification, a direction perpendicular to the array direction in the top view may be referred to as an extending direction (the Y axis direction in FIG. 1). Each of the transistor portions 70 and the diode portions 80 may have a longitudinal length in the extending direction. In other words, the length of each of the transistor portions 70 in the Y axis direction is larger than the width in the X axis direction. Similarly, the length of each of the diode portions 80 in the Y axis direction is larger than the width in the X axis direction. The extending direction of the transistor portion 70 and the diode portion 80, and the longitudinal direction of each trench portion described later may be the same.

Each of the diode portions 80 includes a cathode region of N+ type in a region in contact with the lower surface of the semiconductor substrate 10. In the present specification, a region where the cathode region is provided is referred to as the diode portion 80. In other words, the diode portion 80 is a region that overlaps with the cathode region in the top view. On the lower surface of the semiconductor substrate 10, a collector region of P+ type of may be provided in a region other than the cathode region. In the specification, the diode portion 80 may also include an extension region 81 where the diode portion 80 extends to a gate runner described below in the Y axis direction. The collector region is provided on a lower surface of the extension region 81.

The transistor portion 70 has the collector region of the P+ type in a region in contact with the lower surface of the semiconductor substrate 10. Further, in the transistor portion 70, an emitter region of the N type, a base region of the P type, and a gate structure having a gate conductive portion and a gate dielectric film are periodically arranged on the upper surface side of the semiconductor substrate 10.

The semiconductor device 100 may have one or more pads above the semiconductor substrate 10. The semiconductor device 100 of this example has a gate pad 112. The semiconductor device 100 may have a pad such as an anode pad, a cathode pad, and a current detection pad. Each pad is arranged in a region close to the end side 102. The region close to the end side 102 refers to a region between the end side 102 and the emitter electrode in the top view. When the semiconductor device 100 is mounted, each pad may be connected to an external circuit via a wiring such as a wire.

A gate potential is applied to the gate pad 112. The gate pad 112 is electrically connected to a conductive portion of a gate trench portion of the active portion 160. The semiconductor device 100 includes a gate runner that connects the gate pad 112 and the gate trench portion. In FIG. 1, the gate runner is hatched with diagonal lines.

The gate runner of this example has an outer circumferential gate runner 130 and an active-side gate runner 131. The outer circumferential gate runner 130 is arranged between the active portion 160 and the end side 102 of the semiconductor substrate 10 in the top view. The outer circumferential gate runner 130 of this example encloses the active portion 160 in the top view. A region enclosed by the outer circumferential gate runner 130 in the top view may be the active portion 160. Further, the outer circumferential gate runner 130 is connected to the gate pad 112. The outer circumferential gate runner 130 is arranged above the semiconductor substrate 10. The outer circumferential gate runner 130 may be a metal wiring including aluminum.

The active-side gate runner 131 is provided in the active portion 160. Providing the active-side gate runner 131 in the active portion 160 can reduce a variation in wiring length from the gate pad 112 for each region of the semiconductor substrate 10.

The active-side gate runner 131 is connected to the gate trench portion of the active portion 160. The active-side gate runner 131 is arranged above the semiconductor substrate 10. The active-side gate runner 131 may be a wiring formed of a semiconductor such as polysilicon doped with an impurity.

The active-side gate runner 131 may be connected to the outer circumferential gate runner 130. The active-side gate runner 131 of this example is provided extending in the X axis direction so as to cross the active portion 160 from one outer circumferential gate runner 130 to the other outer circumferential gate runner 130 substantially at the center of the Y axis direction. When the active portion 160 is divided by the active-side gate runner 131, the transistor portion 70 and the diode portion 80 may be alternately arranged in the X axis direction in each divided region.

Further, the semiconductor device 100 may include a temperature sensing portion (not shown) that is a PN junction diode formed of polysilicon or the like, and a current detection portion (not shown) that simulates an operation of the transistor portion provided in the active portion 160.

The semiconductor device 100 of this example includes an edge termination structure portion 90 between the active portion 160 and the end side 102 in the top view. The edge termination structure portion 90 of this example is arranged between the outer circumferential gate runner 130 and the end side 102. The edge termination structure portion 90 relaxes an electric field concentration on the upper surface side of the semiconductor substrate 10. The edge termination structure portion 90 may include at least one of a guard ring, a field plate, and a RESURF which are annularly provided to enclose the active portion 160.

Figure 2:
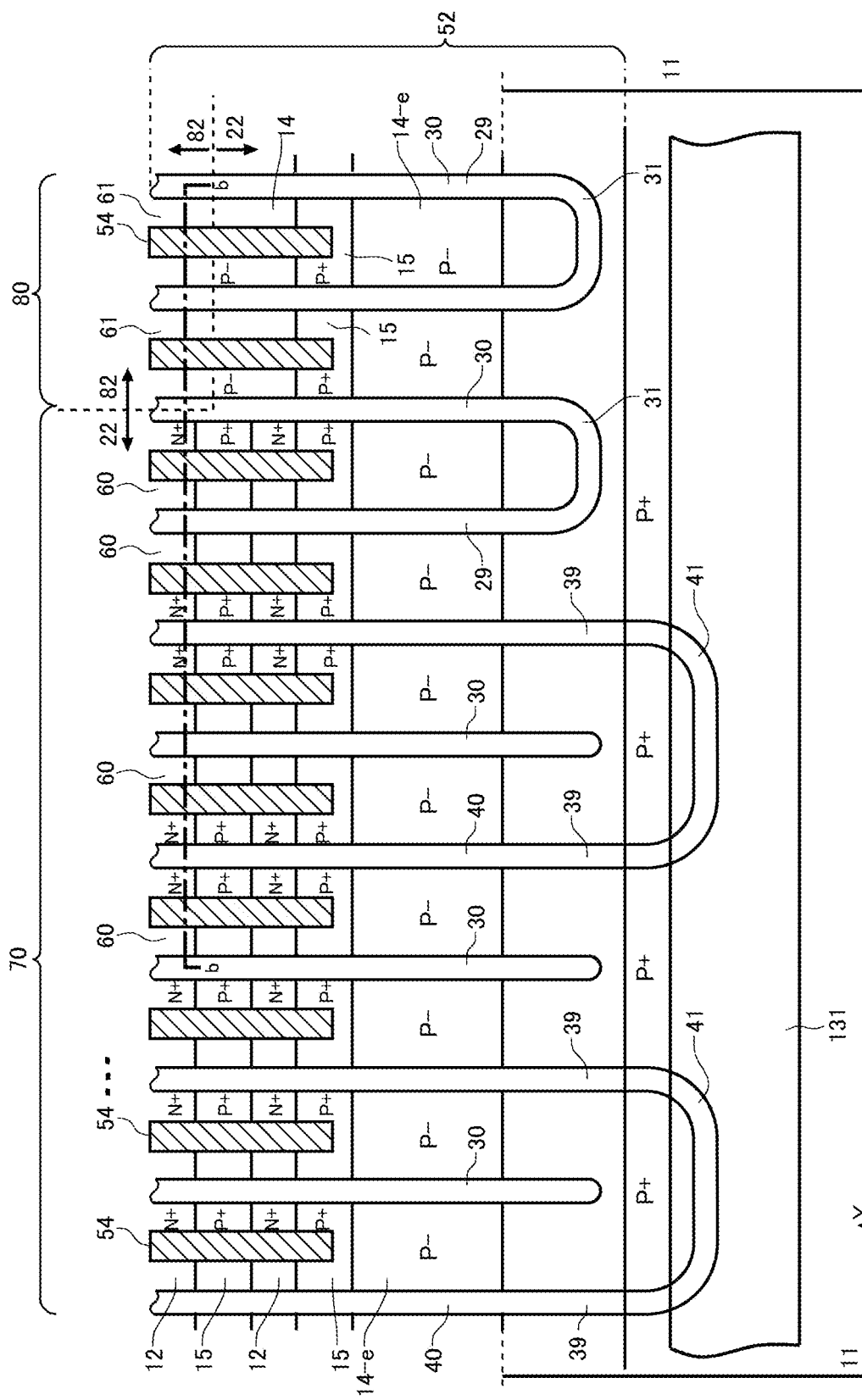
FIG. 2 illustrates an enlarged view of a region A in FIG. 1.

FIG. 2 illustrates an enlarged view of a region A in FIG. 1. The region A is a region including the transistor portion 70, the diode portion 80, and the active-side gate runner 131. The semiconductor device 100 of this example includes a gate trench portion 40, a dummy trench portion 30, a well region 11, an emitter region 12, a base region 14, and a contact region 15 which are provided inside the upper surface side of the semiconductor substrate 10. The gate trench portion 40 and the dummy trench portion 30 each are an example of the trench portion. Further, the semiconductor device 100 of this example includes an emitter electrode 52 and the active-side gate runner 131 that are provided above the upper surface of the semiconductor substrate 10. The emitter electrode 52 and the active-side gate runner 131 are provided in isolation each other.

An interlayer dielectric film is provided between the emitter electrode 52 and the active-side gate runner 131, and the upper surface of the semiconductor substrate 10, but the interlayer dielectric film is omitted in FIG. 2. In the interlayer dielectric film of this example, a contact hole 54 is provided passing through the interlayer dielectric film. In FIG. 2, each contact hole 54 is hatched with the diagonal lines.

The emitter electrode 52 is provided on the upper side of the gate trench portion 40, the dummy trench portion 30, the well region 11, the emitter region 12, the base region 14, and the contact region 15. The emitter electrode 52 is in contact with the emitter region 12, the contact region 15, and the base region 14 on the upper surface of the semiconductor substrate 10, through the contact hole 54. Further, the emitter electrode 52 is connected to a dummy conductive portion in the dummy trench portion 30 through the contact hole provided in the interlayer dielectric film. The emitter electrode 52 may be connected to the dummy conductive portion of the dummy trench portion 30 at an edge of the dummy trench portion 30 in the Y axis direction.

The active-side gate runner 131 is connected to the gate trench portion 40 through the contact hole provided in the interlayer dielectric film. The active-side gate runner 131 may be connected to a gate conductive portion of the gate trench portion 40 at an edge portion 41 of the gate trench portion 40 in the Y axis direction. The active-side gate runner 131 is not connected to the dummy conductive portion in the dummy trench portion 30.

The emitter electrode 52 is formed of a material including a metal. FIG. 2 shows a range where the emitter electrode 52 is provided. For example, at least a part of a region of the emitter electrode 52 is formed of aluminum or an aluminum-silicon alloy, for example, a metal alloy such as AlSi, AlSiCu. The emitter electrode 52 may have a barrier metal formed of titanium, a titanium compound, or the like below a region formed of aluminum or the like. Further, a plug, which is formed by embedding tungsten or the like so as to be in contact with the barrier metal and aluminum or the like, may be included in the contact hole.

The well region 11 is provided overlapping the active-side gate runner 131. The well region 11 is provided so as to extend with a predetermined width even in a range not overlapping the active-side gate runner 131. The well region 11 of this example is provided away from an end of the contact hole 54 in the Y axis direction toward the active-side gate runner 131 side. The well region 11 is a second conductivity type region in which the doping concentration is higher than the base region 14. The base region 14 of this example is a P− type, and the well region 11 is a P+ type.

Each of the transistor portion 70 and the diode portion 80 includes a plurality of trench portions arranged in the array direction. In the transistor portion 70 of this example, one or more gate trench portions 40 and one or more dummy trench portions 30 are alternately provided along the array direction. In the diode portion 80 of this example, the plurality of dummy trench portions 30 are provided along the array direction. In the diode portion 80 of this example, the gate trench portion 40 is not provided.

The gate trench portion 40 of this example may have two linear portions 39 extending along the extending direction perpendicular to the array direction (portions of a trench that are linear along the extending direction), and the edge portion 41 connecting the two linear portions 39. The extending direction in FIG. 2 is the Y axis direction.

At least a part of the edge portion 41 is desirably provided in a curved shape in a top view. By connecting between end portions of the two linear portions 39 in the Y axis direction by the edge portion 41, it is possible to relax the electric field concentration at the end portions of the linear portions 39.

In the transistor portion 70, the dummy trench portions 30 are provided between the respective linear portions 39 of the gate trench portions 40. Between the respective linear portions 39, one dummy trench portion 30 may be provided or a plurality of dummy trench portions 30 may be provided. The dummy trench portion 30 may have a linear shape extending in the extending direction, or may have linear portions 29 and an edge portion 31 similar to the gate trench portion 40. The semiconductor device 100 shown in FIG. 2 includes both of the linear dummy trench portion 30 having no edge portion 31, and the dummy trench portion 30 having the edge portion 31. A direction in which the linear portion 39 of the gate trench portion 40 or the linear portion 29 of the dummy trench portion 30 extend to be long in the extending direction is referred to as a longitudinal direction of the trench portion. The longitudinal direction of the gate trench portion 40 or the dummy trench portion 30 may match the extending direction. In this example, the extending direction and the longitudinal direction are the Y axis directions. The array direction in which the plurality of gate trench portions 40 or the dummy trench portions 30 are arrayed is referred to as a lateral direction of the trench portion. The lateral direction may match the array direction.

The lateral direction may also be perpendicular to the longitudinal direction. In this example, the lateral direction is perpendicular to the longitudinal direction. In this example, the array direction and the lateral direction are the X axis directions.

A diffusion depth of the well region 11 may be deeper than the depth of the gate trench portion 40 and the dummy trench portion 30. The end portions in the Y axis direction of the gate trench portion 40 and the dummy trench portion 30 are provided in the well region 11 in a top view. In other words, the bottom in the depth direction of each trench portion is covered with the well region 11 at the end portion in the Y axis direction of each trench portion. With this configuration, the electric field concentration on the bottom portion of each trench portion can be relaxed.

A mesa portion is provided between the respective trench portions in the array direction. The mesa portion refers to a region sandwiched between the trench portions inside the semiconductor substrate 10. As an example, an upper end of the mesa portion is the upper surface of the semiconductor substrate 10. The depth position of the lower end of the mesa portion is the same as the depth position of the lower end of the trench portion. The mesa portion of this example is provided extending in the extending direction (the Y axis direction) along the trench portion, on the upper surface of the semiconductor substrate 10. In this example, a mesa portion 60 is provided in the transistor portion 70, and a mesa portion 61 is provided in the diode portion 80. In the case of simply mentioning "mesa portion" in the present specification, the portion refers to each of the mesa portion 60 and the mesa portion 61.

Each mesa portion is provided with the base region 14. In the mesa portion, a region arranged closest to the active-side gate runner 131, in the base region 14 exposed on the upper surface of the semiconductor substrate 10, is to be a base region 14-e. While FIG. 2 shows the base region 14-e arranged at one end portion of each mesa portion in the extending direction, the base region 14-e is also arranged at the other end portion of each mesa portion. Each mesa portion may be provided with at least one of a first conductivity type of emitter region 12, and a second conductivity type of contact region 15 in a region sandwiched between the base regions 14-e in the top view. The emitter region 12 of this example is an N+ type, and the contact region 15 is a P+ type. The emitter region 12 and the contact region 15 may be provided between the base region 14 and the upper surface of the semiconductor substrate 10 in the depth direction.

The mesa portion 60 of the transistor portion 70 has the emitter region 12 exposed on the upper surface of the semiconductor substrate 10. The emitter region 12 is provided in contact with the gate trench portion 40. The mesa portion 60 in contact with the gate trench portion 40 may be provided with the contact region 15 exposed on the upper surface of the semiconductor substrate 10.

Each of the contact region 15 and the emitter region 12 in the mesa portion 60 is provided from one trench portion to the other trench portion in the X axis direction. As an example, the contact region 15 and the emitter region 12 in the mesa portion 60 are alternately arranged along the extending direction of the trench portion (the Y axis direction).

In another example, the contact region 15 and the emitter region 12 in the mesa portion 60 may be provided in a stripe shape along the extending direction of the trench portion (the Y axis direction). For example, the emitter region 12 is provided in a region in contact with the trench portion, and the contact region 15 is provided in a region sandwiched between the emitter regions 12.

The mesa portion 61 of the diode portion 80 is not provided with the emitter region 12. The base region 14 and the contact region 15 may be provided on an upper surface of the mesa portion 61. In the region sandwiched between the base regions 14-e on the upper surface of the mesa portion 61, the contact region 15 may be provided in contact with each base region 14-e. The base region 14 may be provided in a region sandwiched between the contact regions 15 on the upper surface of the mesa portion 61. The base region 14 may be arranged in the entire region sandwiched between the contact regions 15.

The contact hole 54 is provided above each mesa portion. The contact hole 54 is arranged in the region sandwiched between the base regions 14-e. The contact hole 54 of this example is provided above respective regions of the contact region 15, the base region 14, and the emitter region 12. The contact hole 54 is not provided in regions corresponding to the base region 14-e and the well region 11. The contact hole 54 may be arranged at the center of the mesa portion 60 in the array direction (the X axis direction).

In the diode portion 80, a cathode region 82 of the N+ type is provided in a region in direct contact with the lower surface of the semiconductor substrate 10. On the lower surface of the semiconductor substrate 10, a collector region of the P+ type 22 may be provided in a region where the cathode region 82 is not provided. The cathode region 82 and the collector region 22 are provided between a lower surface 23 of the semiconductor substrate 10 and a buffer region 20. In FIG. 2, a boundary between the cathode region 82 and the collector region 22 is indicated by a dotted line.

The cathode region 82 is arranged separately from the well region 11 in the Y axis direction. With this configuration, the distance between the P type region (the well region 11) having a relatively high doping concentration and formed up to the deep position, and the cathode region 82 is ensured, so that the breakdown voltage can be improved. The end portion in the Y axis direction of the cathode region 82 of this example is arranged farther away from the well region 11 than the end portion in the Y axis direction of the contact hole 54. In another example, the end portion in the Y axis direction of the cathode region 82 may be arranged between the well region 11 and the contact hole 54.

Figure 3:
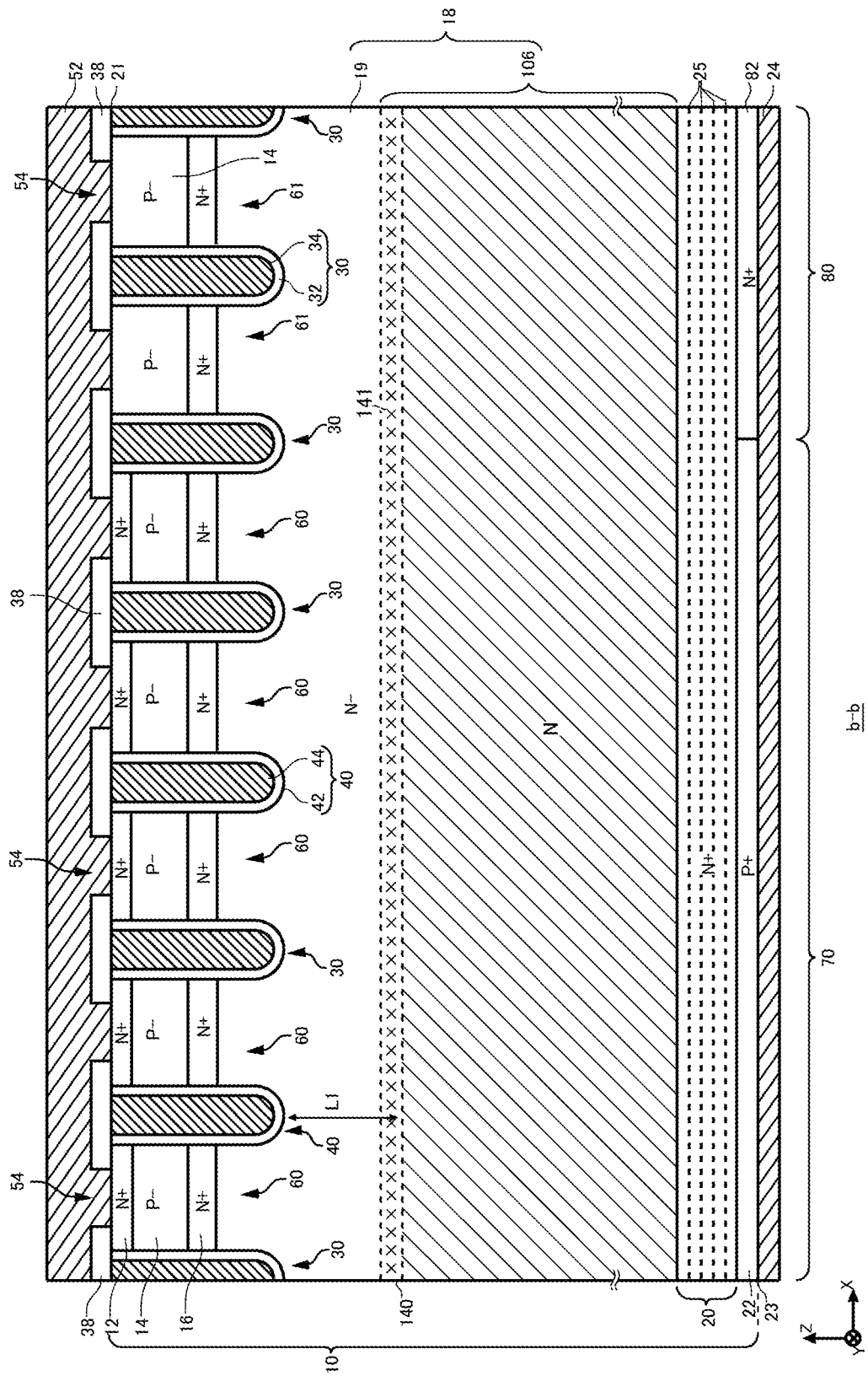
FIG. 3 illustrates one example of a cross section b-b in FIG. 2.

FIG. 3 illustrates a view showing an example of a cross section b-b in FIG. 2. The cross section b-b is an XZ plane passing through the emitter region 12 and the cathode region 82. The semiconductor device 100 of this example includes the semiconductor substrate 10, the interlayer dielectric film 38, the emitter electrode 52, and the collector electrode 24 in the cross section. The semiconductor substrate 10 has an upper surface 21 and a lower surface 23. The upper surface 21 and the lower surface 23 are two principal surfaces of the semiconductor substrate 10. In the specification, orthogonal axes in the plane that is parallel to the upper surface 21 and the lower surface 23 is referred to as an x axis and a y axis, and the perpendicular axis to the upper surface 21 and the lower surface 23 is referred to as a z axis.

The interlayer dielectric film 38 is provided on the upper surface of the semiconductor substrate 10. The interlayer dielectric film 38 is a film including at least one layer of a dielectric film such as silicate glass to which an impurity such as boron or phosphorous is added, a thermal oxide film, and other dielectric films. The interlayer dielectric film 38 is provided with the contact hole 54 described in FIG. 2.

The emitter electrode 52 is provided on the upper side of the interlayer dielectric film 38. The emitter electrode 52 is in contact with an upper surface 21 of the semiconductor substrate 10 through the contact hole 54 of the interlayer dielectric film 38. The collector electrode 24 is provided on a lower surface 23 of the semiconductor substrate 10. The emitter electrode 52 and the collector electrode 24 are formed of a metal material such as aluminum. In the specification, the direction in which the emitter electrode 52 is connected to the collector electrode 24 (the Z axis direction) is referred to as a depth direction.

The semiconductor substrate 10 includes an N type drift region 18. The drift region 18 is provided in each of the transistor portion 70 and the diode portion 80.

In the mesa portion 60 of the transistor portion 70, an N+ type of emitter region 12 and a P− type of base region 14 are provided in order from an upper surface 21 side of the semiconductor substrate 10. The drift region 18 is provided below the base region 14. The mesa portion 60 may be provided with an N+ type of accumulation region 16. The accumulation region 16 is arranged between the base region 14 and the drift region 18.

The emitter region 12 is exposed on the upper surface 21 of the semiconductor substrate 10 and is provided in contact with gate trench portion 40. The emitter region 12 may be in contact with the trench portions on both sides of the mesa portion 60. The emitter region 12 has a higher doping concentration than the drift region 18.

The base region 14 is provided below the emitter region 12. The base region 14 of this example is provided in contact with the emitter region 12. The base region 14 may be in contact with the trench portions on both sides of the mesa portion 60.

The accumulation region 16 is provided below the base region 14. The accumulation region 16 is an N+ type region with a higher doping concentration than the drift region 18. By providing the accumulation region 16 having the high concentration between the drift region 18 and the base region 14, it is possible to improve a carrier injection enhancement effect (IE effect) and reduce an on-voltage. The accumulation region 16 may be provided to cover a whole lower surface of the base region 14 in each mesa portion 60.

The mesa portion 61 of the diode portion 80 is provided with the P− type of base region 14 in contact with the upper surface 21 of the semiconductor substrate 10. The drift region 18 is provided below the base region 14. In the mesa portion 61, the accumulation region 16 may be provided below the base region 14.

In each of the transistor portion 70 and the diode portion 80, an N+ type buffer region 20 may be provided below the drift region 18. The doping concentration of the buffer region 20 is higher than the doping concentration of the drift region 18. The buffer region 20 has a concentration peak 25 having a higher doping concentration than the doping concentration of the drift region 18. The doping concentration of the concentration peak 25 indicates a doping concentration at the apex of the concentration peak 25. Further, as the doping concentration of the drift region 18, an average value of doping concentrations in the region where the doping concentration distribution is approximately flat may be used. A region with an approximately flat doping concentration distribution may be a region with a length of 10 μm or more in the depth direction and a doping concentration variation within ±10%. The buffer region 20 in this example has three or more concentration peaks 25 in the depth direction (Z axis direction) of the semiconductor substrate 10. The concentration peak 25 of the buffer region 20 may be provided at the same depth position as, for example, a concentration peak of hydrogen (a proton) or phosphorous. The buffer region 20 may function as a field stopper layer which prevents a depletion layer expanding from the lower end of the base region 14 from reaching the collector region of the P+ type 22 and the cathode region of the N+ type 82.

In the transistor portion 70, the collector region of the P+ type 22 is provided below the buffer region 20. An acceptor concentration of the collector region 22 is higher than an acceptor concentration of the base region 14. The collector region 22 may include an acceptor which is the same as or different from an acceptor of the base region 14. The acceptor of the collector region 22 is, for example, boron.

Below the buffer region 20 in the diode portion 80, the cathode region 82 of the N+ type is provided. A donor concentration of the cathode region 82 is higher than a donor concentration of the drift region 18. A donor of the cathode region 82 is, for example, hydrogen or phosphorous. Note that an element serving as a donor and an acceptor in each region is not limited to the above described example. The collector region 22 and the cathode region 82 are exposed on the lower surface 23 of the semiconductor substrate 10 and are connected to the collector electrode 24. The collector electrode 24 may be in contact with the entire lower surface 23 of the semiconductor substrate 10. The emitter electrode 52 and the collector electrode 24 are formed of a metal material such as aluminum.

One or more gate trench portions 40 and one or more dummy trench portions 30 are provided on the upper surface 21 side of the semiconductor substrate 10. Each trench portion passes through the base region 14 from the upper surface 21 of the semiconductor substrate 10, and reaches the drift region 18. In a region where at least any one of the emitter region 12, the contact region 15, and the accumulation region 16 is provided, each trench portion also passes through the doping regions of these to reach the drift region 18. The configuration of the trench portion penetrating the doping region is not limited to the one manufactured in the order of forming the doping region and then forming the trench portion. The configuration of the trench portion penetrating the doping region includes a configuration of the doping region being formed between the trench portions after forming the trench portion.

As described above, the transistor portion 70 is provided with the gate trench portion 40 and the dummy trench portion 30. In the diode portion 80, the dummy trench portion 30 is provided, and the gate trench portion 40 is not provided. The boundary in the X axis direction between the diode portion 80 and the transistor portion 70 in this example is the boundary between the cathode region 82 and the collector region 22.

The gate trench portion 40 includes a gate trench provided in the upper surface 21 of the semiconductor substrate 10, a gate dielectric film 42, and a gate conductive portion 44. The gate dielectric film 42 is provided to cover the inner wall of the gate trench. The gate dielectric film 42 may be formed by oxidizing or nitriding a semiconductor on the inner wall of the gate trench. The gate conductive portion 44 is provided inside from the gate dielectric film 42 in the gate trench. That is, the gate dielectric film 42 insulates the gate conductive portion 44 from the semiconductor substrate 10. The gate conductive portion 44 is formed of a conductive material such as polysilicon.

The gate conductive portion 44 may be provided longer than the base region 14 in the depth direction. The gate trench portion 40 in the cross section is covered by the interlayer dielectric film 38 on the upper surface 21 of the semiconductor substrate 10. The gate conductive portion 44 is electrically connected to the gate runner. When a predetermined gate voltage is applied to the gate conductive portion 44, a channel is formed by an electron inversion layer in a surface layer of the base region 14 at a boundary in contact with the gate trench portion 40.

The dummy trench portions 30 may have the same structure as the gate trench portions 40 in the cross section. The dummy trench portion 30 includes a dummy trench provided in the upper surface 21 of the semiconductor substrate 10, a dummy dielectric film 32, and a dummy conductive portion 34. The dummy conductive portion 34 is electrically connected to the emitter electrode 52. The dummy dielectric film 32 is provided covering an inner wall of the dummy trench. The dummy conductive portion 34 is provided in the dummy trench, and is provided inside the dummy dielectric film 32. The dummy dielectric film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon or the like. The dummy conductive portion 34 may have the same length as the gate conductive portion 44 in the depth direction.

The gate trench portion 40 and the dummy trench portion 30 of this example are covered with the interlayer dielectric film 38 on the upper surface 21 of the semiconductor substrate 10. It is noted that the bottoms of the dummy trench portion 30 and the gate trench portion 40 may be formed in a curved-surface shape (a curved-line shape in the cross section) convexly downward.

The semiconductor substrate 10 in this example has bulk donors of the first conductivity type (N type) distributed throughout. The bulk donors are dopant donors that are substantially uniformly included in the ingot during the manufacturing of the ingot used to make the semiconductor substrate 10. The bulk donor of this example is an element other than hydrogen. The bulk donor dopants include, but are not limited to, phosphorous, antimony, arsenic, selenium, and sulfur, for example. The bulk donor in this example is phosphorous. The bulk donor is also included in the P type region. The semiconductor substrate 10 may be a wafer that is cut off from a semiconductor ingot, or may be a chip made from singulated pieces of a wafer. The semiconductor ingot may be manufactured by any of the Czochralski method (CZ method), the magnetic field applied Czochralski method (MCZ method), or the float zone method (FZ method). The ingot in this example is manufactured by the MCZ method. The bulk donor concentration may use the chemical concentration of the bulk donor distributed throughout the semiconductor substrate 10, or may be a value between 90% and 100% of the chemical concentration.

The semiconductor substrate 10 has a first high concentration region 106 in the active portion 160 that includes hydrogen and has a higher donor concentration than the bulk donor concentration. The first high concentration region 106 can be formed by implanting hydrogen from the lower surface 23 of the semiconductor substrate 10 toward the hydrogen implantation region 140 and perform heat treatment.

In the region where the hydrogen ions implanted from the lower surface 23 pass through, lattice defects mainly composed of vacancies such as monatomic vacancies (V) and diatomic vacancies (VV) are formed. The atom adjacent to the vacancies has a dangling bond. Although lattice defects may include interstitial atoms, dislocations and so on, and in a broad sense can also include donors and acceptors, in the present specification, lattice defects mainly composed of vacancies may be referred to as vacancy-type lattice defects, vacancy-type defects, or simply lattice defects. In addition, the crystallinity of the semiconductor substrate 10 can be strongly disturbed by the formation of many lattice defects due to hydrogen ion implantation into the semiconductor substrate 10. In the present specification, this crystallinity disorder may be referred to as disorder. Also, as the hydrogen implanted into the hydrogen implantation region 140 and buffer region 20 diffuses into the pass-through region, the vacancies (V) and oxygen (O) existing in the pass-through region combine with hydrogen (H) to form VOH defects. VOH defects function as donors to supply electrons.

The formation of VOH defects increases the doping concentration in the hydrogen pass-through region. In this example, the doping concentration in the region from the lower surface 23 to the hydrogen implantation region 140 increases. Therefore, the first high concentration region 106, which has a higher concentration than the bulk donor concentration, is formed in the hydrogen pass-through region.

The first high concentration region 106 may be provided over the entire active portion 160 in the top view. The first high concentration region 106 may be provided in a partial region on the lower surface 23 side of the drift region 18. The first high concentration region 106 may be in contact with the buffer region 20. When the buffer region 20 is not provided, the first high concentration region 106 may be in contact with the collector region 22 and may be in contact with the cathode region 82. The doping concentration in the first high concentration region 106 is lower than the peak value of any of the doping concentrations in the cathode region 82, collector region 22, and buffer region 20. In this example, the donor concentration due to VOH defects is sufficiently lower than the doping concentration in the buffer region 20, cathode region 82, and collector region 22. Therefore, in the example of FIG. 3, it is considered that the first high concentration region 106 is not provided in the buffer region 20, cathode region 82, and collector region 22.

Herein, the region where the doping concentration is the bulk donor concentration is referred to as the low concentration region 19. In the example of FIG. 3, the drift region 18 remaining in the region between the buffer region 20 and the accumulation region 16, where the first high concentration region 106 is not formed, is the low concentration region 19.

The hydrogen implantation region 140 may be provided on the upper surface 21 side of the semiconductor substrate 10. The upper surface 21 side refers to the region between the upper surface 21 and the center of the semiconductor substrate 10 in the depth direction. As a result, the first high concentration region 106 can be formed over a large region from the upper end of the buffer region 20 to the upper surface 21 side of the semiconductor substrate 10. This makes it possible to adjust the doping concentration over a large region.

Normally, the semiconductor substrate 10 with a bulk donor concentration Db must be prepared to correspond to the characteristics of the element to be formed on the semiconductor substrate 10, especially the rated voltage or breakdown voltage. In contrast, according to the semiconductor device 100, the donor concentration and range of the first high concentration region 106 can be partially higher than the bulk donor concentration Db by controlling the hydrogen ion dosing amount and implantation depth. Therefore, even if the semiconductor substrate 10 with a different bulk donor concentration Db is used, an element with a predetermined rated voltage or breakdown voltage characteristics can be formed. In addition, although the variation in donor concentration during the manufacture of the semiconductor substrate 10 is relatively large, the dosing amount of hydrogen ions can be controlled with relatively high precision. Therefore, the concentration of vacancies (V) created by the implantation of hydrogen ions can also be controlled with high precision, and the donor concentration in the first high concentration region 106 can be controlled with high precision.

Also, the hydrogen implantation region 140 is preferably arranged on the lower surface 23 side of the semiconductor substrate 10, rather than the lower end of the gate trench portion 40. In other words, it is preferable to implant hydrogen ions from the lower surface 23 to the extent that hydrogen ions do not reach the gate trench portion 40. This enables to prevent hydrogen ions from passing through the gate dielectric film 42, thereby suppressing the deterioration of the gate dielectric film 42.

The hydrogen chemical concentration distribution in the depth direction of the semiconductor substrate 10 has a first hydrogen concentration peak 141 in the hydrogen implantation region 140. In FIG. 3, the depth position of the first hydrogen concentration peak 141 is schematically marked with an X mark.

The distance L1 in the Z axis direction between the first hydrogen concentration peak 141 and the lower end of the gate trench portion 40 is preferably far enough away that hydrogen is not implanted to the gate trench portion 40 even if variations occur in the range during hydrogen implantation. The distance L1 may be 3 times or more, or 5 times or more, or 10 times or more than the standard deviation σ of the first hydrogen concentration peak 141 in the hydrogen chemical concentration distribution in the depth direction. However, in a case to form a wider first high concentration region 106, it is preferable to have a smaller distance L1. The distance L1 may be 20 times or less than the standard deviation described above, and may be 10 times or less than the standard deviation.

Figure 4:
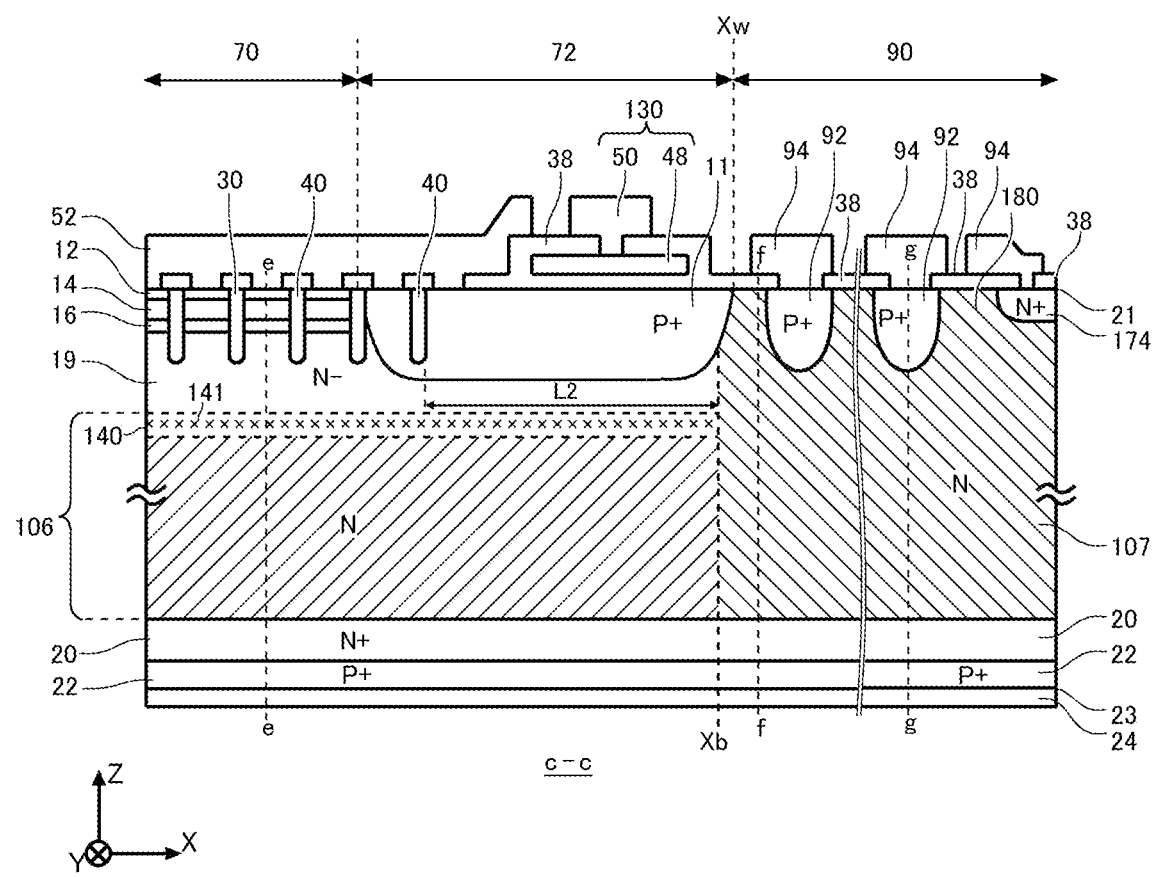
FIG. 4 illustrates one example of a cross section c-c in FIG. 1.

FIG. 4 illustrates one example of a cross section c-c in FIG. 1. The cross section c-c is the XZ plane that includes the edge termination structure portion 90 and the transistor portion 70. In this example, a boundary portion 72 is provided between the edge termination structure portion 90 and the transistor portion 70. The structure of the transistor portion 70 is the same as that of the transistor portion 70 described in FIG. 2 and FIG. 3.

The boundary portion 72 has an outer circumferential gate runner 130 and a well region 11. The well region 11 is a P+ type region having a higher doping concentration than the base region 14. The well region 11 is provided to extend from the upper surface 21 of the semiconductor substrate 10 to a position deeper than the lower end of the trench portion. The well region 11 makes it easier to separate the active portion 160 from the edge termination structure portion 90. The region enclosed by the well region 11 in a top view may be used as the active portion 160. One or more trench portions may be provided inside the well region 11. By providing the trench portion arranged at the end of the plurality of trench portions in the well region 11, the electric field concentration in the trench portion can be relaxed.

The outer circumferential gate runner 130 is provided above the well region 11. The outer circumferential gate runner 130 in this example includes a gate metal layer 50 formed of a metal such as aluminum and a gate runner 48 formed of a semiconductor such as polysilicon with impurities doped in it. The gate runner 48 is arranged above the well region 11 sandwiching the interlayer dielectric film 38 in between. The gate metal layer 50 is arranged above the gate runner 48 sandwiching the interlayer dielectric film 38 in between. The gate metal layer 50 and gate runner 48 are connected by through holes provided in the interlayer dielectric film 38.

The edge termination structure portion 90 is provided with a plurality of guard rings 92, a plurality of field plates 94, and a channel stopper 174. In the edge termination structure portion 90, in a region in contact with the lower surface 23, the collector region 22 may be provided. The collector region 22 is also provided with a buffer region 20. The buffer region 20 has one or more hydrogen chemical concentration peaks.

Each guard ring 92 may be provided to enclose the active portion 160 at the upper surface 21. The plurality of guard rings 92 may have a function of extending the depletion layer generated in the active portion 160 to an outside of the semiconductor substrate 10. This makes it possible to prevent the electric field concentration inside the semiconductor substrate 10 and to improve the breakdown voltage of the semiconductor device 100.

The guard ring 92 in this example is a P+ type semiconductor region formed by ion implantation near the upper surface 21. A depth of a bottom portion of the guard ring 92 may be deeper than depths of bottom portions of the gate trench portion 40 and the dummy trench portion 30.

An upper surface of the guard ring 92 is covered with the interlayer dielectric film 38. The field plate 94 is formed of a conductive material such as metal or polysilicon. The field plate 94 may be formed of the same material as the gate metal layer 50 or the emitter electrode 52. The field plate 94 is provided on the interlayer dielectric film 38. The field plate 94 is connected to the guard ring 92 through a through hole provided in the interlayer dielectric film 38.

The channel stopper 174 is provided exposed on the upper surface 21 and the side surface at the end side 102. The channel stopper 174 is a region of the N type whose doping concentration is higher than the drift region 18. The channel stopper 174 has the function of terminating the depletion layer generated in the active portion 160 at the end side 102 of the semiconductor substrate 10.

The semiconductor substrate 10 has a second high concentration region 107 at the edge termination structure portion 90 that includes hydrogen and has a higher donor concentration than the bulk donor concentration. The second high concentration region 107 is provided in a range that is wider than the first high concentration region 106 in the depth direction of the semiconductor substrate 10.

The second high concentration region 107 can be formed by implanting hydrogen ions from the lower surface 23 of the semiconductor substrate 10 and perform heat treatment. The second high concentration region 107 may be formed by implanting hydrogen ions through the semiconductor substrate 10, or be formed by implanting hydrogen ions at a position on the upper surface 21 side than the hydrogen implantation region 140 in the active portion 160. This allows the second high concentration region 107 to be formed in a range that is wider than the first high concentration region 106 in the Z axis direction. In the example of FIG. 4, the second high concentration region 107 is formed by implanting hydrogen ions so that they pass through the semiconductor substrate 10. Therefore, the second high concentration region 107 in the example of FIG. 4 has no concentration peak in the hydrogen chemical concentration distribution in the depth direction.

By forming the second high concentration region 107 widely in the Z axis direction, the region of high resistivity can be reduced in the edge termination structure portion 90. This makes it easier to ensure the breakdown voltage of the semiconductor device 100 even if the length of the edge termination structure portion 90 in the X axis direction is reduced.

The second high concentration region 107 may be in contact with the upper surface 21 of the semiconductor substrate 10. The second high concentration region 107 in this example is provided from the upper end of the buffer region 20 to the upper surface 21 of the semiconductor substrate 10. The edge termination structure portion 90 may not have to be provided with a low concentration region 19. The second high concentration region 107 is also provided between the well region 11 and the guard ring 92, between two of the guard rings 92, and between the guard ring 92 and the channel stopper 174.

The doping concentration in the second high concentration region 107 is lower than the peak value of any of the doping concentrations in the guard ring 92, the channel stopper 174, and the buffer region 20. Therefore, in the example of FIG. 4, the guard ring 92, channel stopper 174, and buffer region 20 are considered to have no second high concentration region 107 provided therein.

The second high concentration region 107 may be provided over the entire edge termination structure portion 90 in the top view. The edge termination structure portion 90 in this example is the region from the end portion position Xw of the well region 11 to the end side 102 of the semiconductor substrate 10 on the upper surface 21 of the semiconductor substrate 10.

In the X axis direction, the first high concentration region 106 and the second high concentration region 107 may be in contact with each other. The boundary position Xb in the X axis direction of the first high concentration region 106 and the second high concentration region 107 may be arranged in the active portion 160 side rather than the end portion position Xw of the well region 11. The boundary position Xb may overlap with the well region 11 in the Z axis direction.

The distance L2 in the X axis direction of the boundary position Xb and the gate trench portion 40 arranged at the end in the X axis direction is preferably far enough to prevent the hydrogen implanted to form the second high concentration region 107 from passing through the gate dielectric film 42. The gate trench portion 40 is arranged closest to the second high concentration region 107 in the X axis direction. The distance L2 may be 3 times or more, or 5 times or more, or 10 times or more than the standard deviation σ of the first hydrogen concentration peak 141 in the hydrogen chemical concentration distribution in the depth direction. The distance L2 may be larger than the distance L1. The distance L2 may be more than half the width of the well region 11 in the X axis direction.

Figure 5:
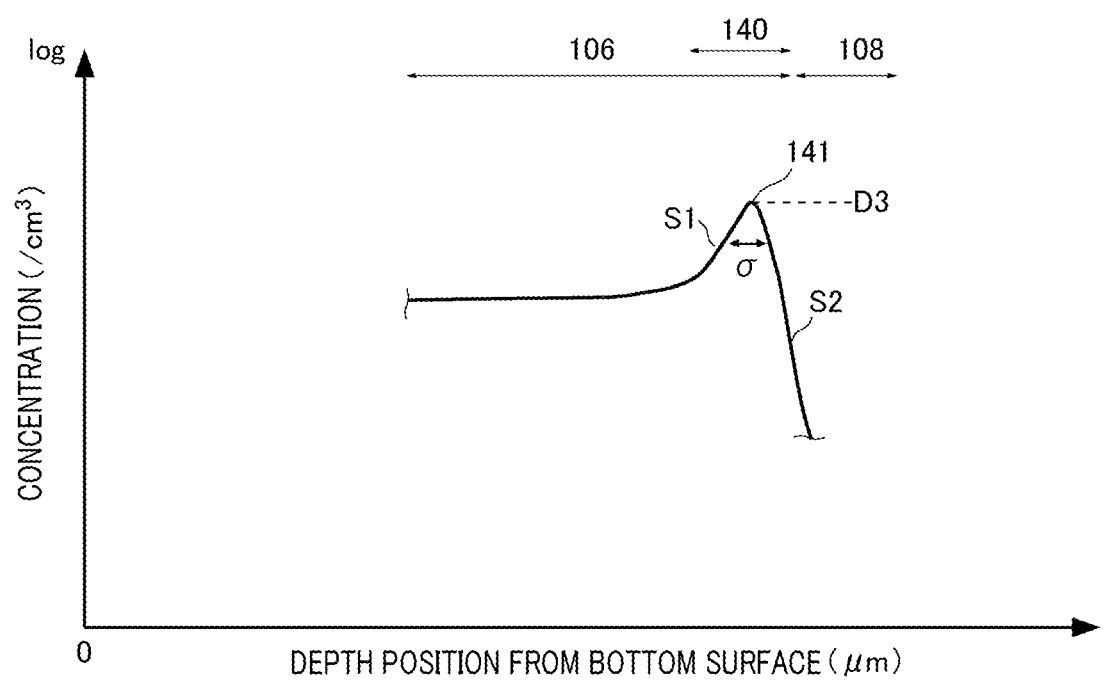
FIG. 5 illustrates one example of a hydrogen chemical concentration distribution in a depth direction in the vicinity of a hydrogen implantation region 140.

FIG. 5 illustrates one example of the hydrogen chemical concentration distribution in the depth direction in the vicinity of the hydrogen implantation region 140. As mentioned above, in the hydrogen implantation region 140, the hydrogen chemical concentration distribution has a first hydrogen concentration peak 141. The first hydrogen concentration peak 141 is the region where the hydrogen chemical concentration shows the local maximum value D3.

The standard deviation σ of the first hydrogen concentration peak 141 mentioned above is the standard deviation in the concentration distribution of a mountain shape including the local maximum value D3. By making the distances L1 and L2 sufficiently large with respect to the standard deviation σ, it is possible to suppress hydrogen ions from passing through the gate dielectric film 42.

It is noted that the hydrogen chemical concentration distribution has a hem S1 on the lower surface 23 side and has a hem S2 on the upper surface 21 side than the first hydrogen concentration peak 141. In this example, the hydrogen is implanted from the lower surface 23 side. Therefore, the slope of the hem S1 may be smaller than that of the hem S2. In other words, the hem S2 may have a steeper variation in hydrogen chemical concentration than the hem S1. By comparing the hems on both sides of the first hydrogen concentration peak 141, it may be possible to determine from which side of the lower surface 23 and the upper surface 21 the hydrogen was implanted.

Figure 6:
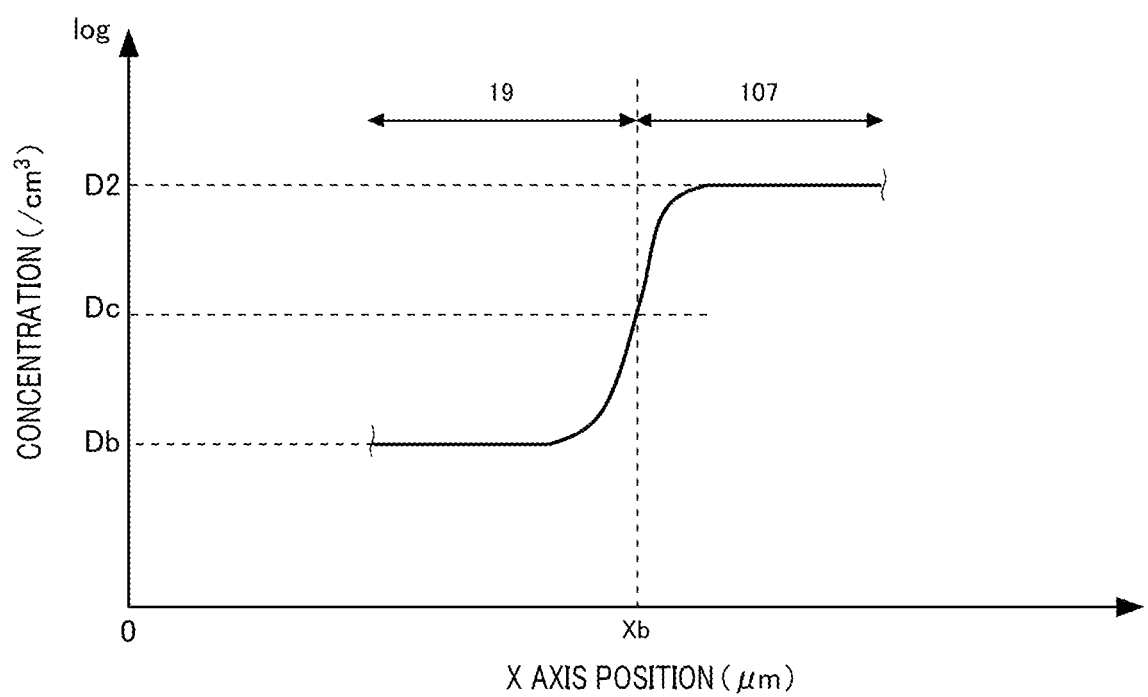
FIG. 6 illustrates one example of a doping concentration distribution in the X axis direction.

FIG. 6 illustrates one example of the doping concentration distribution in the X axis direction. FIG. 6 illustrates the distribution from the low concentration region 19 to the second high concentration region 107. As shown in FIG. 4, the boundary position Xb between the low concentration region 19 and the second high concentration region 107 can be regarded as the boundary position Xb between the first high concentration region 106 and the second high concentration region 107.

The doping concentration varies from the doping concentration Db in the low concentration region 19 to the doping concentration D2 in the second high concentration region 107 in the vicinity of the boundary position Xb. The boundary position Xb may be the position where the doping concentration becomes Dc, the concentration between D2 and Db.

Figure 7:
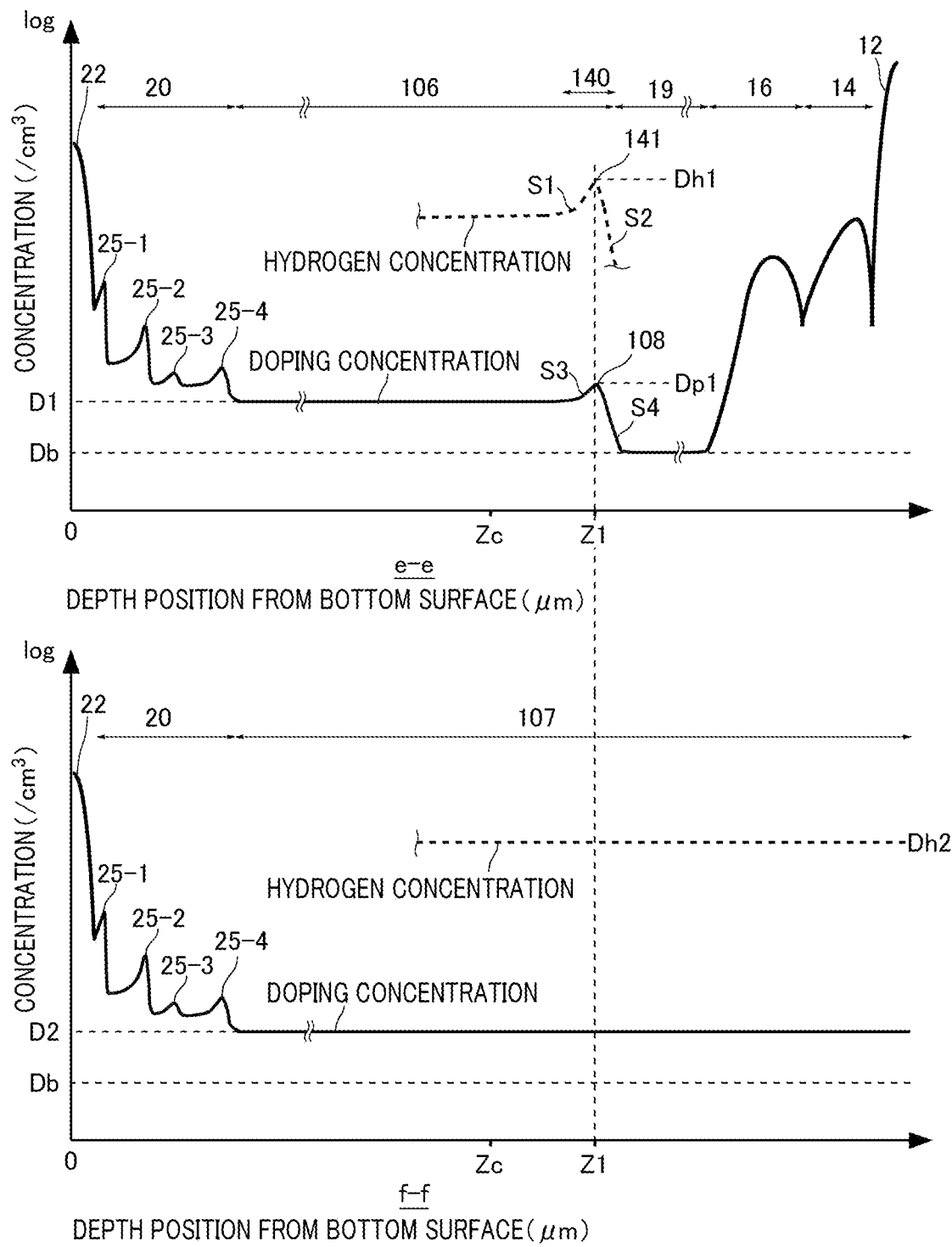
FIG. 7 illustrates one example of a doping concentration distribution along a line e-e and a line f-f in FIG. 4.

FIG. 7 illustrates one example of the doping concentration distribution along the line e-e and the line f-f in FIG. 4. The line e-e is a line in the Z axis direction that passes through the emitter region 12 in the transistor portion 70. The line f-f is a line in the Z axis direction that passes between the well region 11 and the guard ring 92 at the edge termination structure portion 90. The line e-e passes through the first high concentration region 106, and the line f-f passes through the second high concentration region 107. In FIG. 7, the hydrogen chemical concentration distribution in the vicinity of the depth position Z1 is also shown together. The depth position Z1 is the depth position of the first hydrogen concentration peak 141 of the hydrogen chemical concentration distribution in the first high concentration region 106.

The buffer region 20 in this example has a plurality of concentration peaks 25-1, 25-2, 25-3, and 25-4 in the doping concentration distribution. Each of the concentration peaks 25 is formed by implanting hydrogen ions, but the peaks of the hydrogen chemical concentration distribution corresponding to the concentration peaks 25 are omitted in FIG. 7.

The first hydrogen concentration peak 141 of the hydrogen chemical concentration distribution of the first high concentration region 106 is arranged between the center Zc in the depth direction of the semiconductor substrate 10 and the accumulation region 16. On the other hand, in the second high concentration region 107, no peak of hydrogen chemical concentration is provided at the depth position Z1. The hydrogen chemical concentration distribution in the depth direction of the second high concentration region 107 may be flat or may be linear with a small slope. A flat hydrogen chemical concentration distribution may refer to the fact that a variation range of hydrogen chemical concentration is within ±50% throughout the entire second high concentration region 107 in the depth direction.

In the edge termination structure portion 90, the hydrogen chemical concentration Dh2 at the same depth position Z1 as the first hydrogen concentration peak 141 may be lower than the hydrogen chemical concentration Dh1 at the first hydrogen concentration peak 141. For example, with the same hydrogen dosing amount, the active portion 160 is implanted with hydrogen toward the depth position Z1, and the edge termination structure portion 90 is implanted with hydrogen so that it passes through the semiconductor substrate 10. In this case, the hydrogen chemical concentration at depth position Z1 is higher in the active portion 160 than in the edge termination structure portion 90. On the other hand, the hydrogen chemical concentration in the region on the upper surface 21 side than the depth position Z1 may be higher in the edge termination structure portion 90 than in the active portion 160. Also, the hydrogen chemical concentration in the region on the lower surface 23 side than the depth position Z1 may be equal for the edge termination structure portion 90 and the active portion 160. Equal hydrogen chemical concentration may mean that the difference in hydrogen chemical concentration at the same depth position is within ±50%.

Also, at the depth position Z1 of the first hydrogen concentration peak 141, the doping concentration distribution of the first high concentration region 106 may have a first doping concentration peak 108. The first doping concentration peak 108 may have a hem S3 on the lower surface 23 side and a hem S4 on the upper surface 21 side. Similar to the first hydrogen concentration peak 141, the hem S3 may be more gradual than the hem S4.

The doping concentration Dp1 (or the donor concentration) of the first high concentration region 106 at the depth position Z1 may be $1.0 \times 10^{13}/cm^3$ or more, and $2.0 \times 10^{14}/cm^3$ or less. Also, the doping concentration D1 (or the donor concentration) of the first high concentration region 106 on the lower surface 23 side than the depth position Z1 may also be $1.0 \times 10^{13}/cm^3$ or more and $2.0 \times 10^{14}/cm^3$ or less. The doping concentration Dp1 may be 3 times or more, but not more than 7 times of the doping concentration D1. With this configuration, the doping concentration in the first high concentration region 106 can be sufficiently higher than the bulk donor concentration Db, and the doping concentration in the drift region 18 can be precisely controlled.

In the depth range corresponding to the drift region 18, the variation range of the doping concentration distribution in the second high concentration region 107 is smaller than the variation range of the doping concentration distribution in the active portion 160. The doping concentration in the second high concentration region 107 may be flat. A flat doping concentration may refer to a variation range of the doping concentration within ±50% over the entire second high concentration region 107 in the depth direction. As one example, the doping concentration of the second high concentration region 107 may be $7.0 \times 10^{13}/cm^3$ or more, but not more than $8.0 \times 10^{13}/cm^3$.

Also, the doping concentration of the edge termination structure portion 90 may be higher than the bulk donor concentration Db over the entire depth direction of the semiconductor substrate 10. However, at the boundary between the P type region and the N type region, the net value of the doping concentration is smaller than the bulk donor concentration Db.

In the region of the lower surface 23 side than the depth position Z1, the doping concentration D1 (the donor concentration) of the first high concentration region 106 and the doping concentration D2 (the donor concentration) of the second high concentration region 107 may be the same. The same doping concentration means that an error within ±10% may be tolerated. Also, in the region on the upper surface 21 side from the depth position Z1, the doping concentration D2 of the second high concentration region 107 is higher than the doping concentration Db of the low concentration region 19 of the active portion 160.

Figure 8:
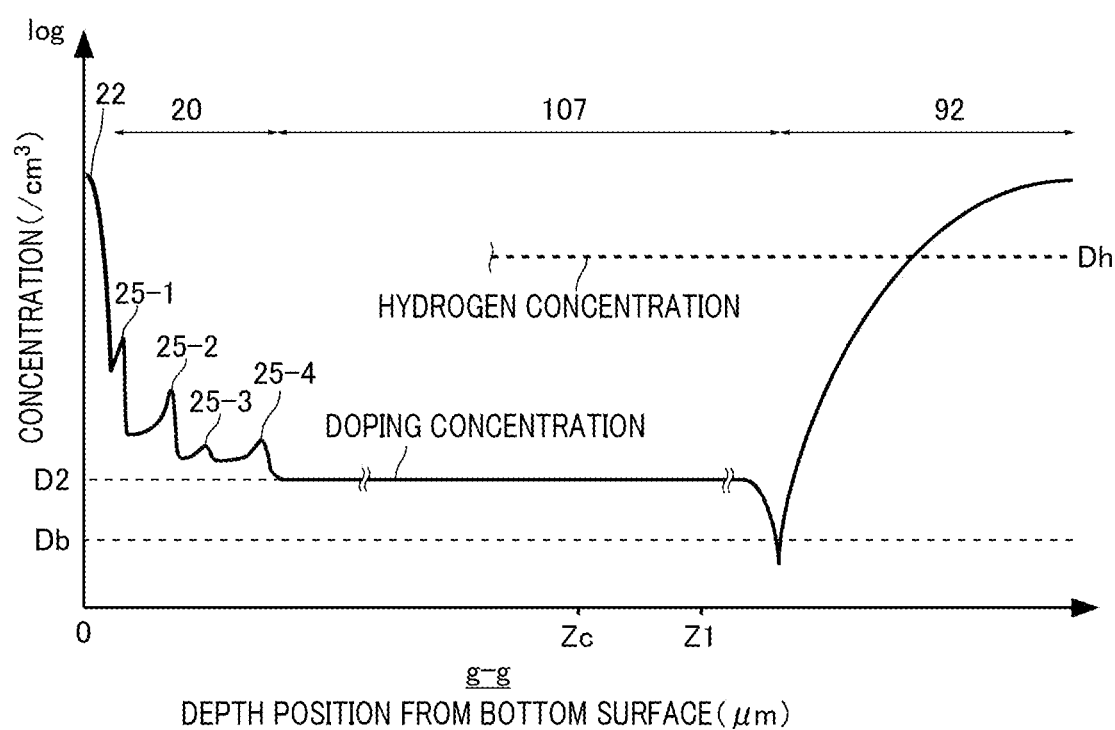
FIG. 8 illustrates one example of a doping concentration distribution along a line g-g in FIG. 4.

FIG. 8 illustrates one example of the doping concentration distribution along the line g-g in FIG. 4. The line g-g passes through the guard ring 92 at the edge termination structure portion 90. The second high concentration region 107 in this example is provided between the buffer region 20 and the guard ring 92. It is noted that the VOH defects are also formed in the guard ring 92, but since the doping concentration of the guard ring 92 is high, the formation of the VOH defects has little effect on the characteristics of the guard ring 92.

Figure 9:
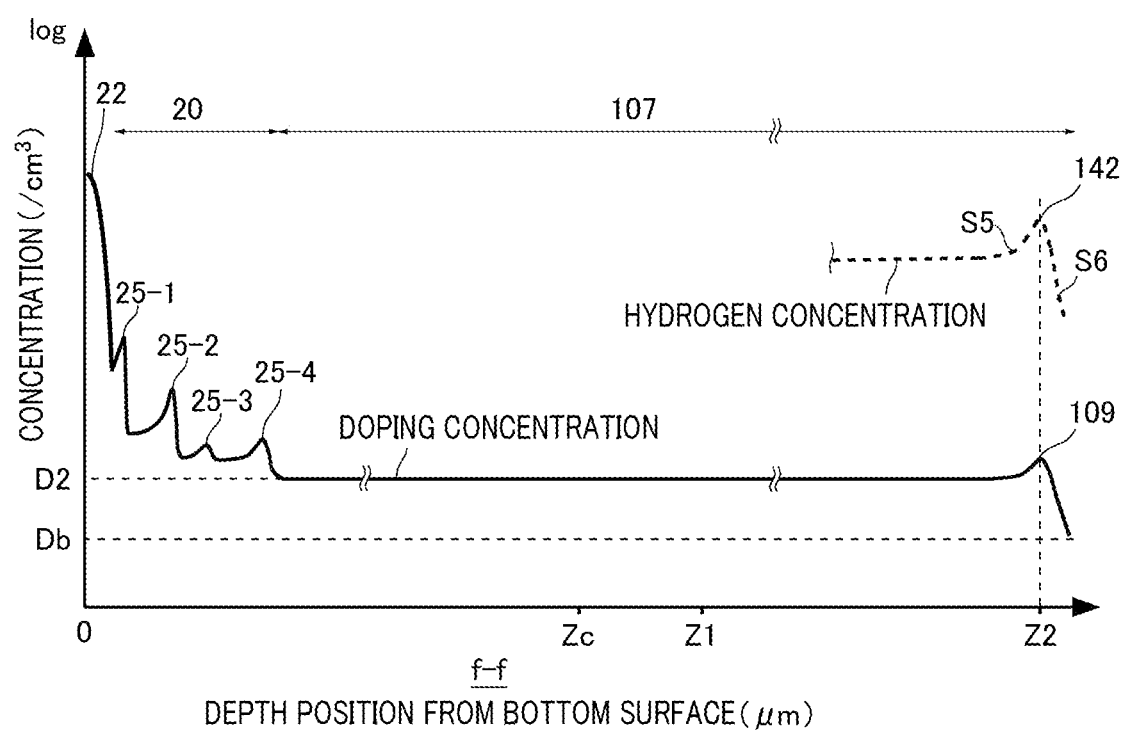
FIG. 9 illustrates another example of the doping concentration distribution and the hydrogen chemical concentration distribution along the line f-f in FIG. 4.

FIG. 9 illustrates another example of doping concentration distribution and hydrogen chemical concentration distribution along the line f-f in FIG. 4. The second high concentration region 107 in this example has a second hydrogen concentration peak 142 in the vicinity of the upper surface 21. The depth position Z2 of the second hydrogen concentration peak 142 is arranged on the upper surface 21 side than the depth position Z1 of the first hydrogen concentration peak 141. The second hydrogen concentration peak 142 may be arranged on the upper surface 21 side than the depth position of the lower end of the trench portion, or may be arranged on the upper surface 21 side than the depth position of the accumulation region 16, or may be arranged on the upper surface 21 side than the depth position of the base region 14.

Such a configuration also allows the second high concentration region 107 to be provided in a range that is wider in the depth direction than the first high concentration region 106. The doping concentration distribution of the second high concentration region 107 may have a second doping concentration peak 109 at depth position Z2. In this example, the doping concentration may be higher than the bulk donor concentration in the entire second high concentration region 107.

Figure 10:
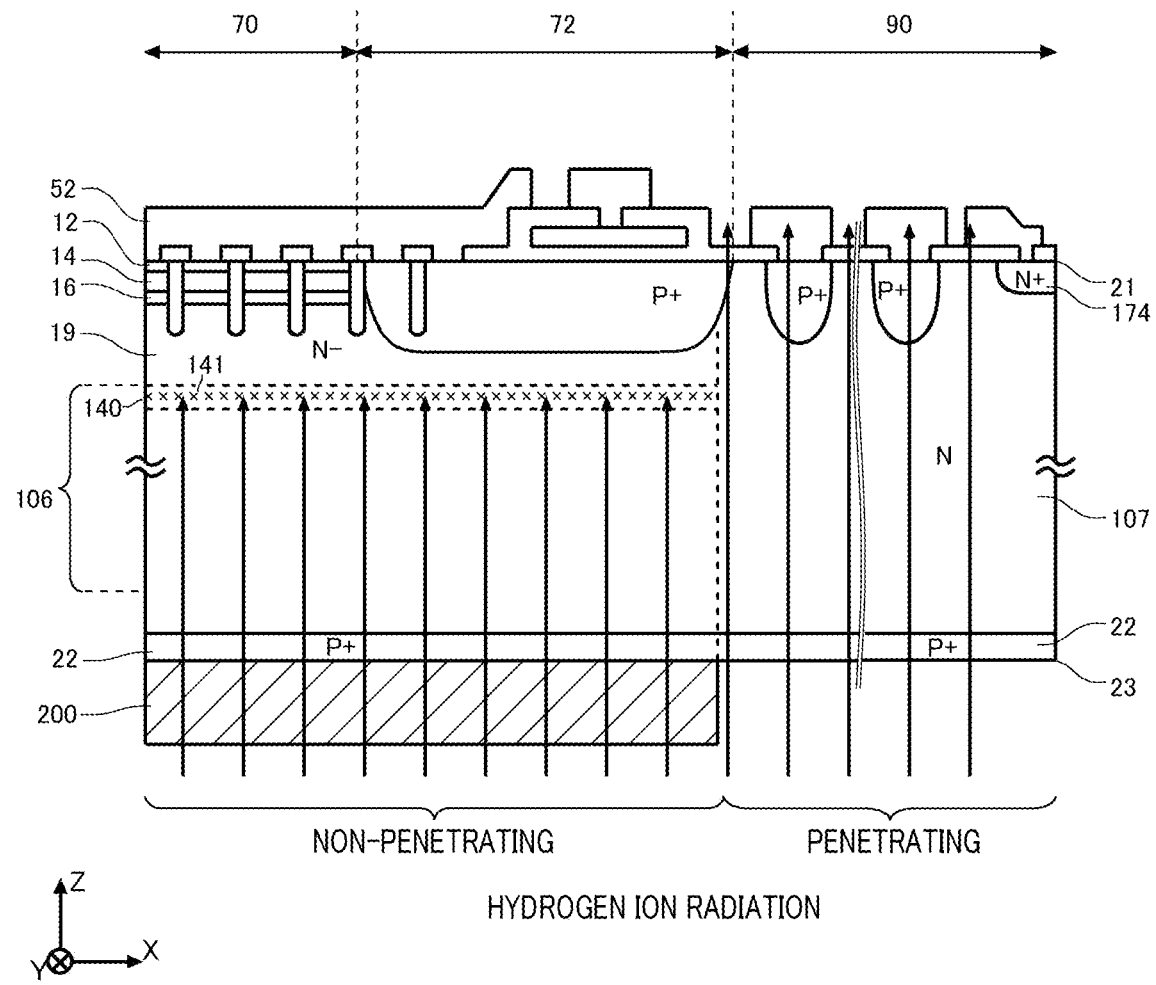
FIG. 10 illustrates one example of a process of implanting hydrogen ion onto the semiconductor substrate 10 for description.

FIG. 10 illustrates one example of a process of implanting hydrogen ion onto the semiconductor substrate 10 for description. In this example, both the active portion 160 and the edge termination structure portion 90 are implanted with hydrogen ions at the same time. This will reduce the cost of hydrogen ion implantation.

First, in the lower surface 23 of the semiconductor substrate 10, selectively form a shielding portion 200 in the region where the active portion 160 is to be provided. The shielding portion 200 may also be provided on at least a part of the boundary portion 72. The shielding portion 200 is, for example, a photosensitive photoresist. Of the lower surface 23 of the semiconductor substrate 10, the region forming the second high concentration region 107 is exposed without being covered by the shielding portion 200.

Next, the entire lower surface 23 of the semiconductor substrate 10 is implanted with hydrogen ions such as protons. At this time, the hydrogen ions are accelerated at an acceleration energy that allows the hydrogen ions to pass through the semiconductor substrate 10 in the region not covered by the shielding portion 200 and does not allow the hydrogen ions to pass through the semiconductor substrate 10 in the region covered by the shielding portion 200. This enables hydrogen to be implanted into the hydrogen implantation region 140 in the active portion 160 covered by the shielding portion 200. By adjusting the thickness of the shielding portion 200, the depth position of the hydrogen implantation region 140 can be adjusted. With such a process, the first high concentration region 106 and the second high concentration region 107 can be formed by the same hydrogen ion implantation process.

Figure 11:
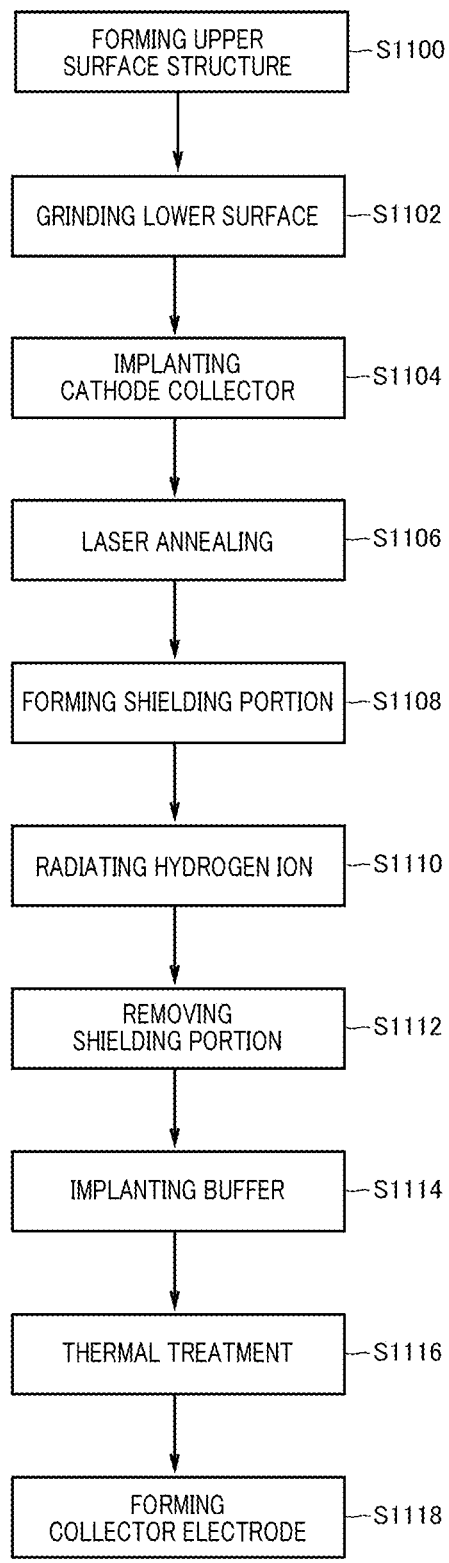
FIG. 11 illustrates one example of a manufacturing method of the semiconductor device 100.

FIG. 11 illustrates one example of the manufacturing method of the semiconductor device 100. In this example, at step S1100, the upper surface structure of the semiconductor device 100 is formed. It refers to the structure provided on the upper surface 21 side of the semiconductor substrate 10 and includes, for example, the trench portion, the emitter region 12, the base region 14, the accumulation region 16, the interlayer dielectric film 38, the emitter electrode 52, the gate runner and so on.

Next, at step S1102, a thickness of the semiconductor substrate 10 is adjusted to grind the lower surface 23 side of the semiconductor substrate 10. Then by a process at step S1104, a structure on the lower surface side of the semiconductor substrate 10 is formed. In this example, dopants are implanted into the cathode region 82 and the collector region 22 at step S1104 and form the cathode region 82 and the collector region 22 by performing local laser annealing at step S1106.

Next, at step S1108, selectively form the shielding portion 200 on the lower surface 23 side of the semiconductor substrate 10. After the shielding portion 200 is formed, hydrogen ions are implanted from the lower surface 23 side at step S1110. Remove the shielding portion 200 at step S1112. After the shielding portion 200 is removed, hydrogen ions are implanted into the buffer region 20. Next, the semiconductor substrate 10 is heat-treated at step S1116. At step S1116, the entire semiconductor substrate 10 may be heat treated by an annealing furnace. This enables hydrogen to diffuse to form the first high concentration region 106, the second high concentration region 107, and the buffer region 20. Next, the collector electrode 24 is formed on the lower surface 23. In this way, the semiconductor device 100 can be manufactured.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate; 11: well region; 12: emitter region; 14: base region; 15: contact region; 16: accumulation region; 18: drift region; 19: low concentration region; 20: buffer region; 21: upper surface; 22: collector region; 23: lower surface; 24: collector electrode; 25: peak; 29: linear portion; 30: dummy trench portion; 31: edge portion; 32: dummy dielectric film; 34: dummy conductive portion; 38: interlayer dielectric film; 39: linear portion; 40: gate trench portion; 41: edge portion; 42: gate dielectric film; 44: gate conductive portion; 48: gate runner; 50: gate metal layer; 52: emitter electrode; 54: contact hole; 60, 61: mesa portion; 70: transistor portion; 72: boundary portion; 80: diode portion; 81: extension region; 82: cathode region; 90: edge termination structure portion; 92: guard ring; 94:field plate; 100: semiconductor device; 102: end side; 106: first high concentration region; 107: second high concentration region; 108: first doping concentration peak; 109: second doping concentration peak; 112: gate pad; 130: outer circumferential gate runner; 131: active-side gate runner; 140: hydrogen implantation region; 141: first hydrogen concentration peak; 142: second hydrogen concentration peak; 160: active portion; 174: channel stopper; 200: shielding portion

What is claimed is:

1. A semiconductor device, comprising:
a semiconductor substrate including a bulk donor;
an active portion provided in the semiconductor substrate; and
an edge termination structure portion provided between the active portion and an end side of the semiconductor substrate in the semiconductor substrate at an upper surface of the semiconductor substrate,
wherein the active portion comprises a first high concentration region, wherein the first high concentration region includes hydrogen and has a higher donor concentration than a donor concentration of the bulk donor,
wherein the semiconductor substrate comprises a buffer region provided below the first high concentration region,
wherein the edge termination structure portion comprises a second high concentration region above the buffer region,
wherein the second high concentration region includes hydrogen and has a higher donor concentration than the donor concentration of the bulk donor,
wherein a distance between an upper surface of the buffer region and an upper surface of the second high concentration region in a depth direction is longer than a distance between the upper surface of the buffer region and an upper surface of the first high concentration region,
wherein a hydrogen concentration distribution in the depth direction in the first high concentration region has a first hydrogen concentration peak, and
wherein in the edge termination structure portion, a hydrogen concentration at a same depth position as the first hydrogen concentration peak is lower than a hydrogen concentration at the first hydrogen concentration peak.

2. The semiconductor device according to claim 1, wherein the second high concentration region is in contact with the upper surface of the semiconductor substrate.

3. The semiconductor device according to claim 1, wherein the active portion has a trench portion provided on the upper surface of the semiconductor substrate; and the first hydrogen concentration peak is arranged in a region from a center in the depth direction of the semiconductor substrate to a bottom portion of the trench portion.

4. The semiconductor device according to claim 1, wherein the donor concentration at the first hydrogen concentration peak is $1.0 \times 10^{13}/cm^3$ or more but not more than $2.0 \times 10^{14}/cm^3$, wherein donors of the first high concentration region include impurities and hydrogen donors.

5. The semiconductor device according to claim 1, wherein the donor concentration at the first hydrogen concentration peak is 3 times or more, but not more than 7 times of a donor concentration in the first high concentration region that is below the first hydrogen concentration peak toward a lower surface of the semiconductor substrate.

6. The semiconductor device according to claim 1, wherein a donor concentration of the first high concentration region is the same as a donor concentration of the second high concentration region at a depth position below the first hydrogen concentration peak toward a lower surface of the semiconductor substrate.

7. The semiconductor device according to claim 1, wherein a donor concentration of the second high concentration region is higher than a donor concentration of the active portion at a depth position that is above the first hydrogen concentration peak toward the upper surface of the semiconductor substrate.

8. The semiconductor device according to claim 1, wherein the active portion has a plurality of gate trench portions provided on the upper surface of the semiconductor substrate in a predetermined interval along an array direction; and among the plurality of the gate trench portions, a distance in the array direction between a gate trench portion arranged at a farthest end in the array direction and the second high concentration region is 3 times or more of a standard deviation of the first hydrogen concentration peak.

9. The semiconductor device according to claim 8, further comprising:
a well region of a P type provided between the active portion and the edge termination structure portion on the upper surface of the semiconductor substrate, and provided from the upper surface of the semiconductor substrate to a depth deeper than a lower end of the gate trench portion, wherein a boundary between the first high concentration region and the second high concentration region in the array direction is overlapped with the well region in the depth direction.

10. A manufacturing method of the semiconductor device according to claim 1, comprising:
implanting hydrogen from a lower surface of the semiconductor substrate while a shielding portion is formed in a region where the active portion is provided on the lower surface of the semiconductor substrate and the lower surface of the semiconductor substrate as a region where the second high concentration region is provided is exposed; and
heat treating the semiconductor substrate.

11. A manufacturing method of the semiconductor device according to claim 2, comprising:
implanting hydrogen from a lower surface of the semiconductor substrate while a shielding portion is formed in a region where the active portion is provided on the lower surface of the semiconductor substrate and the lower surface of the semiconductor substrate as a region where the second high concentration region is provided is exposed; and
heat treating the semiconductor substrate.

12. The manufacturing method according to claim 10, wherein in implanting hydrogen, the hydrogen implanted to a region where the second high concentration region is provided passes through the semiconductor substrate, and the hydrogen implanted to a region where the active portion is provided does not pass through the semiconductor substrate.

* * * * *